United States Patent [19]
Nakatani et al.

[11] Patent Number: 5,757,303
[45] Date of Patent: May 26, 1998

[54] MULTI-BIT A/D CONVERTER HAVING REDUCED CIRCUITRY

[75] Inventors: Yuichi Nakatani; Satoshi Takahashi; Masami Aiura, all of Sendai, Japan

[73] Assignee: Motorola, Inc., Schaumburg, Ill.

[21] Appl. No.: 649,063

[22] Filed: May 16, 1996

[30] Foreign Application Priority Data

May 31, 1995 [JP] Japan ................................ 7-158468

[51] Int. Cl.$^6$ ................................................ H03M 1/36
[52] U.S. Cl. ................................................ 341/159; 341/156
[58] Field of Search ................................ 341/156, 158, 341/159

[56] References Cited

U.S. PATENT DOCUMENTS 5,157,397  10/1992  Vernon ........................ 341/118
5,291,198  3/1994  Dingwall et al. ............... 341/159
5,298,814  3/1994  Caruso ........................... 341/156
5,465,093  11/1995  Kusumoto et al. ............ 341/155

*Primary Examiner*—Howard L. Williams
*Attorney, Agent, or Firm*—Robert D. Atkins

[57] ABSTRACT

The A/D converter comprises a resistor series (30), a plurality of first comparators (1) and a plurality of second comparators (2). Resistor series (30) has a plurality of resistors(R) connected in series between two terminals to which predetermined reference voltages are applied. First comparator (1) compares a node voltage between resistors and an analog voltage signal to be compared. Second comparator (2) compares an average voltage of the two node voltages across each resistor R and the analog voltage signal. First and second comparators (1,2) are disposed alternatively.

1 Claim, 5 Drawing Sheets

MULTI-BIT A/D CONVERTER HAVING REDUCED CIRCUITRY

FIELD OF THE INVENTION

The present invention relates to A/D converters, and more specifically, to an A/D converter that supports multi-bits to provide high performance.

BACKGROUND OF THE INVENTION

Recently, an A/D converter has been used in image input devices, such as video cameras, for example, in order to convert an analog image signal captured by an charge coupled device (CCD) into a digital image signal.

For this purpose, an A/D converter with 8 bits of accuracy (256 gradations) for meeting its minimum requirements is usually employed to achieve full-color image processing.

More recently, however, devices handling high-quality image data, such as HDTV (High Definition Television) and portable camcorders, demand image data processing with higher resolution; for such apparatus that handle high resolution of image data, more sophisticated A/D converters, more specifically, A/D converters with about 9 or 10 bits (512–1024 gradations) of accuracy, are required.

Conventionally, as such an A/D converter, a sub-range A/D converter 10 having multiple clock cycles (two clocks in this example) has been provided, for example, as shown in FIG. 4. FIG. 4 is a circuit diagram showing a schematic configuration of a prior art A/D converter 10.

This A/D converter 10 is comprised mainly of a first group of voltage comparators 11, a second group of voltage comparators 12, a third group of voltage comparators 13, an MSB encoder and position sensing circuit 21, an LSB encoder, position sensing circuit and multiplexer 22, a significant-bit correction circuit 23, an output buffer circuit 24, and a reference voltage ladder 30.

The first group of voltage comparators 11 provides its significant-bit data output to the MSB encoder and position sensing circuit 21 in order to determine the most significant bits (MSB); the second group of voltage comparators 12 and third group of voltage comparators 13 provide their less significant data output to the LSB encoder, position sensing circuit and multiplexer 22 in order to determine the least significant bits (LSB).

The significant-bit correction circuit 23 combines the significant 4 bit output from the MSB encoder and position sensing circuit 21 and the less significant 4 bit output from the LSB encoder, position sensing circuit and multiplexer 22; the output buffer 24 outputs an 8-bit digital signal according to the combined signal.

The reference voltage ladder 30 is a resistor ladder formed by a plurality of resistors 31, 31, . . . , connected between a first reference voltage input terminal 41 and a second reference voltage input terminal 42. Furthermore, the reference voltage ladder 30 has subsections 32 connected between the first reference voltage input terminal 41 and the second reference voltage input terminal 42, and the substeps formed by the subsections 32 are selectively connected by a switch network 33 to the second group of voltage comparators 12 or the third group of voltage comparators 13.

So configured, there is no separation over an effective range of substeps, so that the number of failures to compare between the reference voltage ladder 30 and an unknown voltage to be measured can be reduced, thereby achieving a rate nearly equal to that of a single-clock-cycle parallel type A/D converter.

However, an A/D converter including such a prior art A/D converter 10 is typically comprised of multiple analog switches and inverters; thus, there is a problem in that increasing the number of bits to enhance the accuracy will result in considerably increased circuit scale.

More specifically, with about 8 bits as in the above example, only 256 taps are needed to obtain the reference voltages; however, with 9 bits, 512 taps are required; with 10 bits, 1024 taps are required, and so on.

That is, to produce a high-accuracy A/D converter with the technology used in the afore-mentioned 8-bit A/D converter, about twice the scale of the 8-bit A/D converter, i.e., a 9-bit A/D converter is a limitation.

This is because an increase in circuit scale increases the circuitry to be driven, resulting in an increased load, and also an elongated wire length, so that simultaneity cannot be secured; in this way, with the prior art technology, it is very difficult to achieve a 10-bit A/D converter that is demanded for HDTV and so forth.

To increase the number of bits for the A/D converter without increasing the number of taps, an approach shown in FIG. 5 may be conceivable. FIG. 5 is a circuit diagram for explaining one example of a method for enhancing the accuracy without increasing the number of taps.

That is, the number of taps might be conserved if an analog switch can be connected to an intermediate point of each resistor (a point where the resistance value is reduced by half) without changing the taps present on each of the nodes of multiple resistors R, as shown in FIG. 5.

In this case, however, it is difficult to find an exact intermediate point for each resistor R, and thus impractical.

Accordingly, it is an object of the present invention to provide an A/D converter that supports multi-bits, while minimizing the circuit scale.

DETAILED DESCRIPTION OF THE INVENTION

One preferred embodiment of the present invention is described below with reference to FIG. 1.

Figure 1:
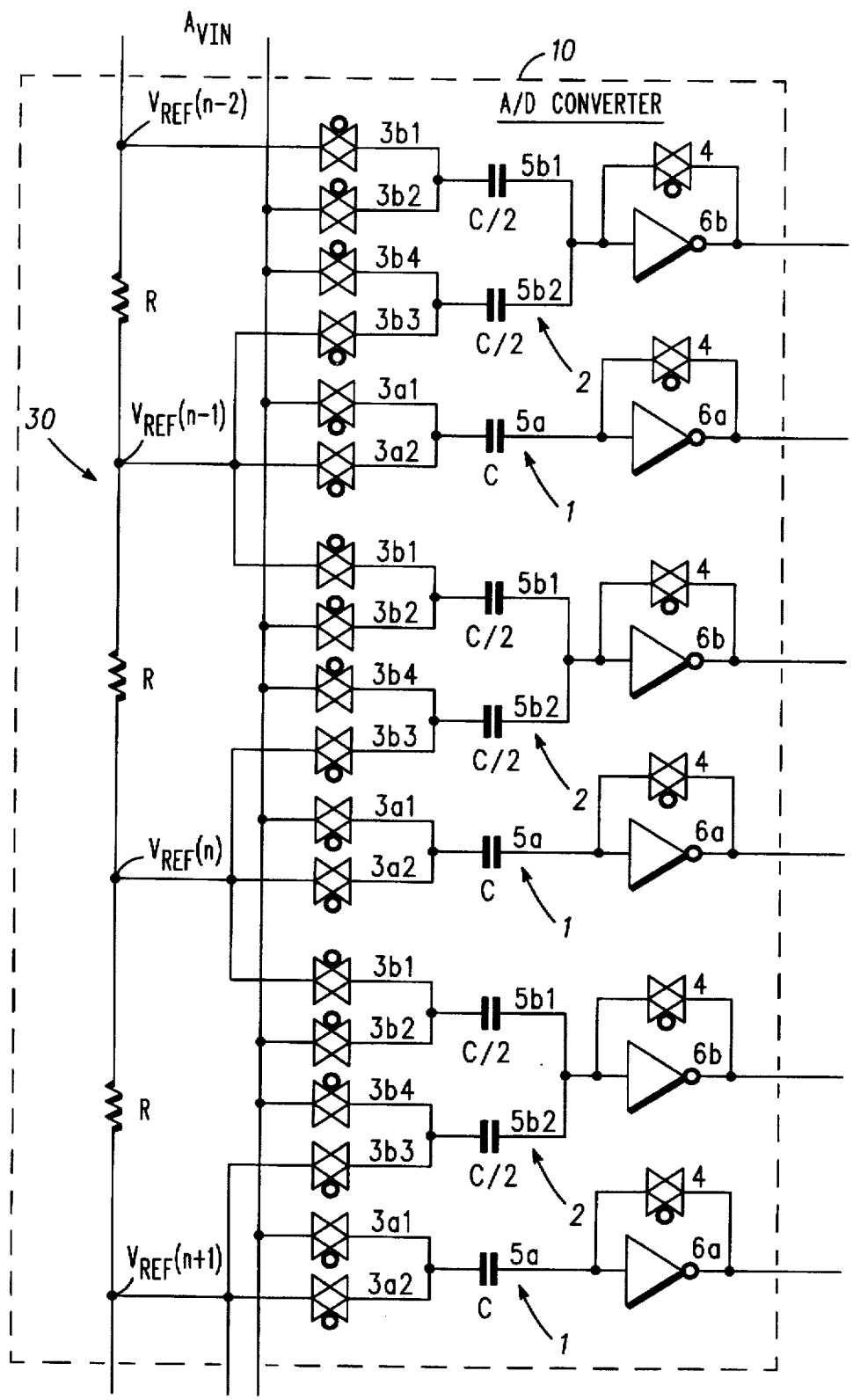
FIG. 1 is a circuit diagram depicting principal portions of an A/D converter according to one embodiment of the present invention.
Figure 4:
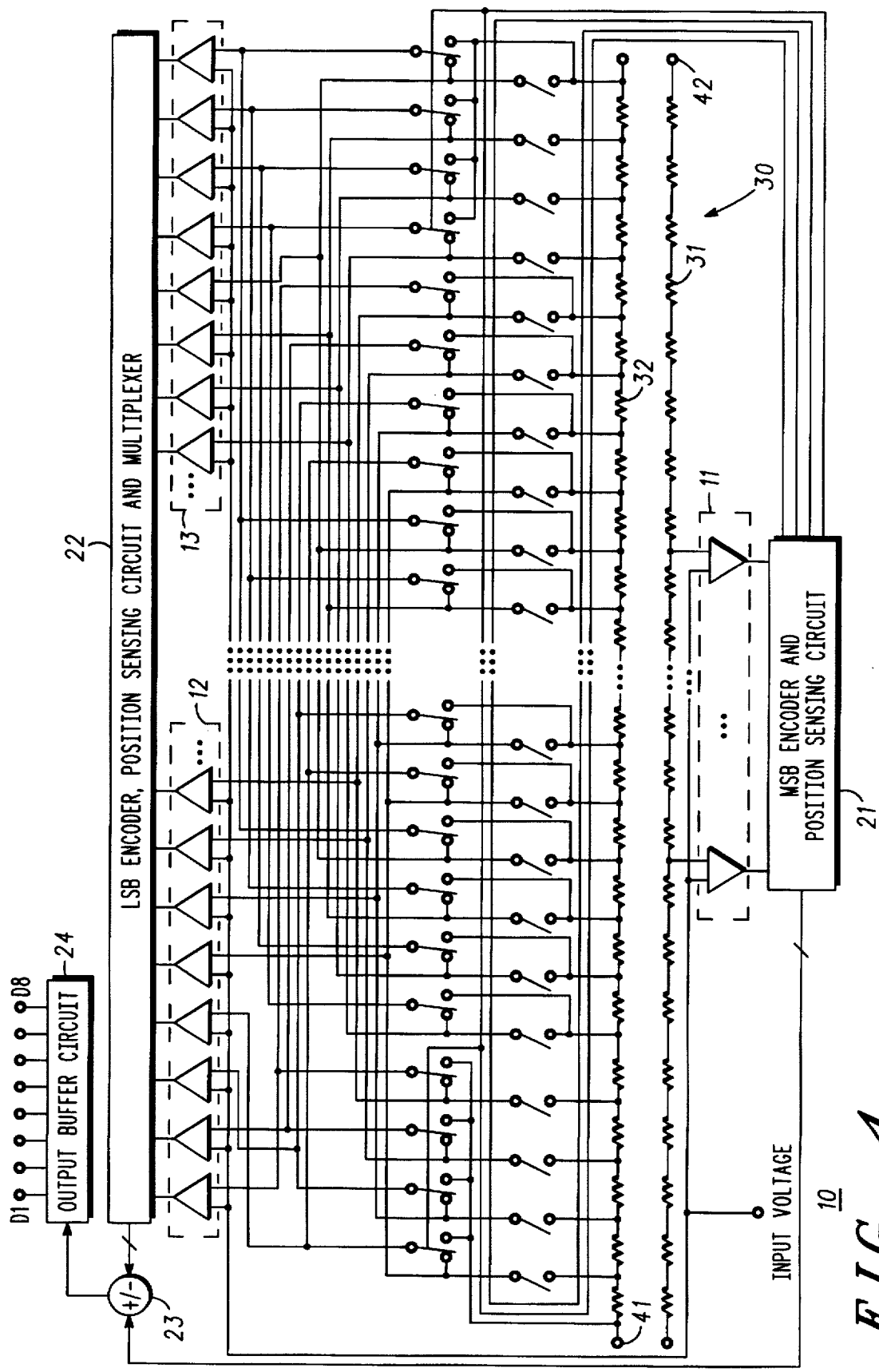
FIG. 4 is a circuit diagram depicting a simplified structure of a prior art A/D converter.
Figure 5:
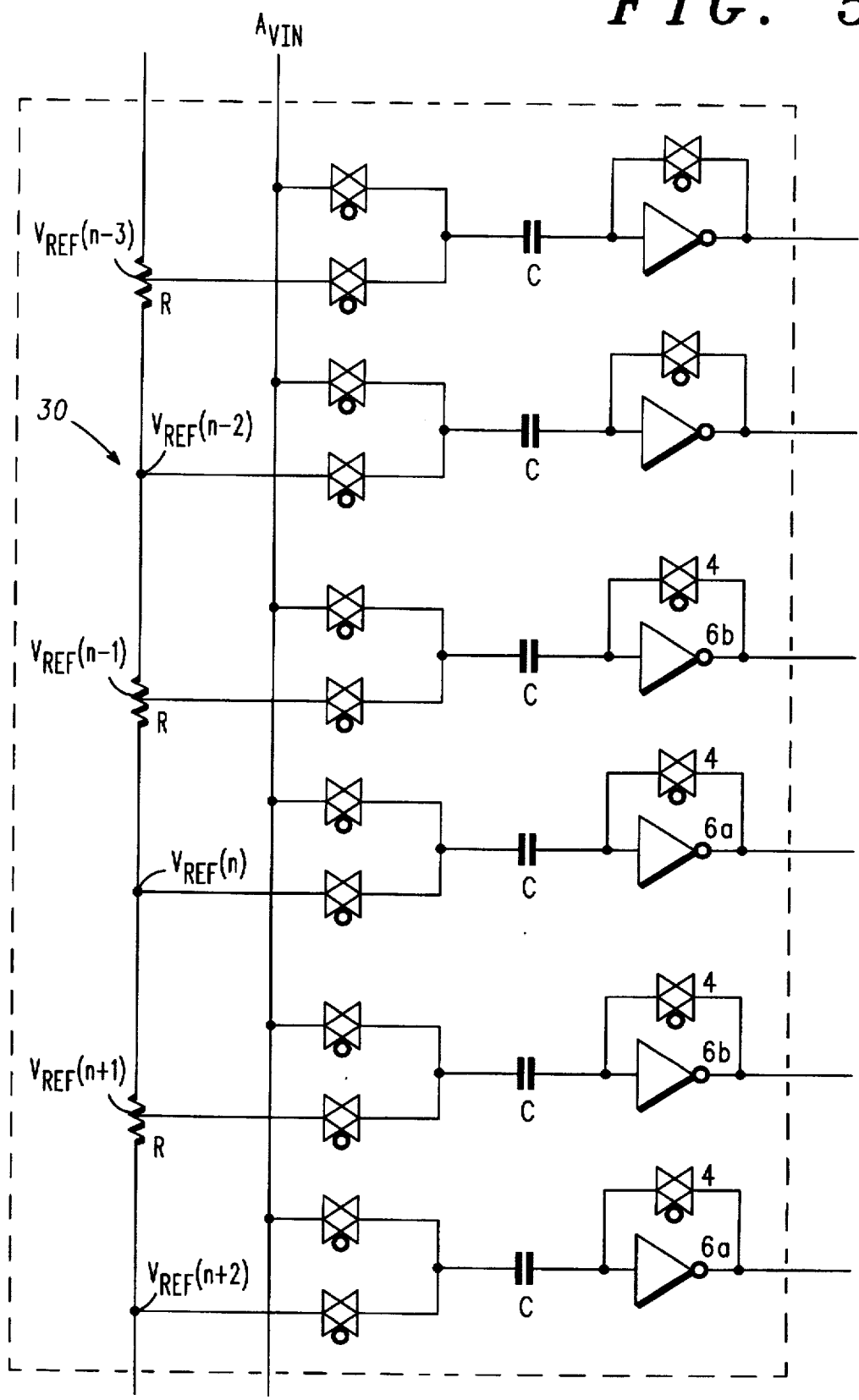
FIG. 5 is a circuit diagram for explaining one illustrative method for enhancing the accuracy without increasing the number of taps.

FIG. 1 is a circuit diagram depicting principal portions of an A/D converter according to one embodiment of the present invention, where the same components as shown in FIG. 4 are denoted by the same reference symbol.

In FIG. 1, an A/D converter 10 according to the present embodiment is mainly comprised of a resistor series 30, a first comparator 1, and a second comparator 2; the first comparator 1 is further comprised of analog switches 3a1, 3a2, 4, a capacitor 5a, and inverters 6a, 6b; the second comparator is further comprised of analog switches 3b1–3b4, capacitors 5b1, 5b2, and an inverter 6.

The resistor series has 512 resistors R connected between two terminals, to which a predetermined reference voltage Vref and ground voltage are applied. By dividing the reference voltage Vref by 512, 512 steps of reference voltage Vref (1–n–512) are generated. This results in 512 taps equivalent to a conventional 9-bit A/D converter in the present embodiment.

The first comparator 1 compares in magnitude between a node (tap) voltage between the resistors R of the resistor series 30 and an analog voltage AVin to be compared. And, the first comparator 1 in the present embodiment is so configured that the node between the resistors R of the resistor series 30 and the analog voltage (AVin) signal line to be compared are connected via individual analog switches 3a1 and 3a2, respectively, to one end of the capacitor 5a having a predetermined capacitance value C, while the other end of the capacitor 5a is connected to an input terminal of the inverter 6a.

The second comparator 2 compares in magnitude between an average voltage of the node voltages across each resistor of the resistor series and the analog voltage AVin to be compared. And, the second comparator 2 in the present embodiment is so configured that a node (e.g., Vref (n–1)) at one end of each resistor R of the resistor series 30 and the analog voltage (AVin) signal line to be compared are connected via individual analog switches 3b1 and 3b2, respectively, to one end of the capacitor 5b1 having a capacitance value of C/2, while the other end of the capacitor 5b1 is connected to an input terminal of an inverter 6b; furthermore, a node (e.g., Vref (n)) at the other end of each resistor R of the resistor series 30 and the analog voltage signal line to be compared are connected, via individual analog switches 3b3 and 3b4, respectively, to one end of the capacitor 5b2 having a capacitance value of C/2, while the other end of the capacitor 5b2 is connected to the input terminal of the inverter 6b.

In addition, these first and second comparators 1 and 2 are disposed alternatively relative to the resistor series, thereby allowing the second comparator 2 to make comparison with the value of analog voltage AVin, using as a reference voltage the average voltage of the reference voltages at the first comparator 1 located at both ends of the second comparator 2. More specifically, the analog switches 3a1, 3b2, 3b4 on the AVin side, as well as the analog switch 4 of the inverters 6a and 6b, are turned on simultaneously to charge the capacitors 5a, 5b1, and 5b2 with the AVin voltage, and then these switches are turned off. Next, by turning on the analog switches 3a2, 3b1, and 3b3 on the Vref side, the output voltage of the inverters 6a and 6b goes "high (H)" because if the voltage on the Vref side is higher than the voltage on the AVin side, a difference therebetween is used as an input voltage; if the voltage on the Vref side is lower than the voltage on the AVin side, the input voltage remains unchanged, so it goes "low (L)". Thus, by detecting an output line that has changed from "H" to "L" in the output voltage arrangement for the inverters 6a and 6b, the step position for the analog voltage can be determined, thereby yielding a digital signal.

In this way, according to the present embodiment, by disposing a second comparator 2 between first comparators 1, the average voltage of the reference voltages for the first comparators can be compared with the analog voltage without increasing the number of taps, which means that the actual number of reference voltages compared is equivalent to twice the number of taps. Thus, the number of bits for the A/D converter can be increased by one bit, without increasing the number of taps for resistors R, thereby resulting in a 10-bit A/D converter.

Figure 2:
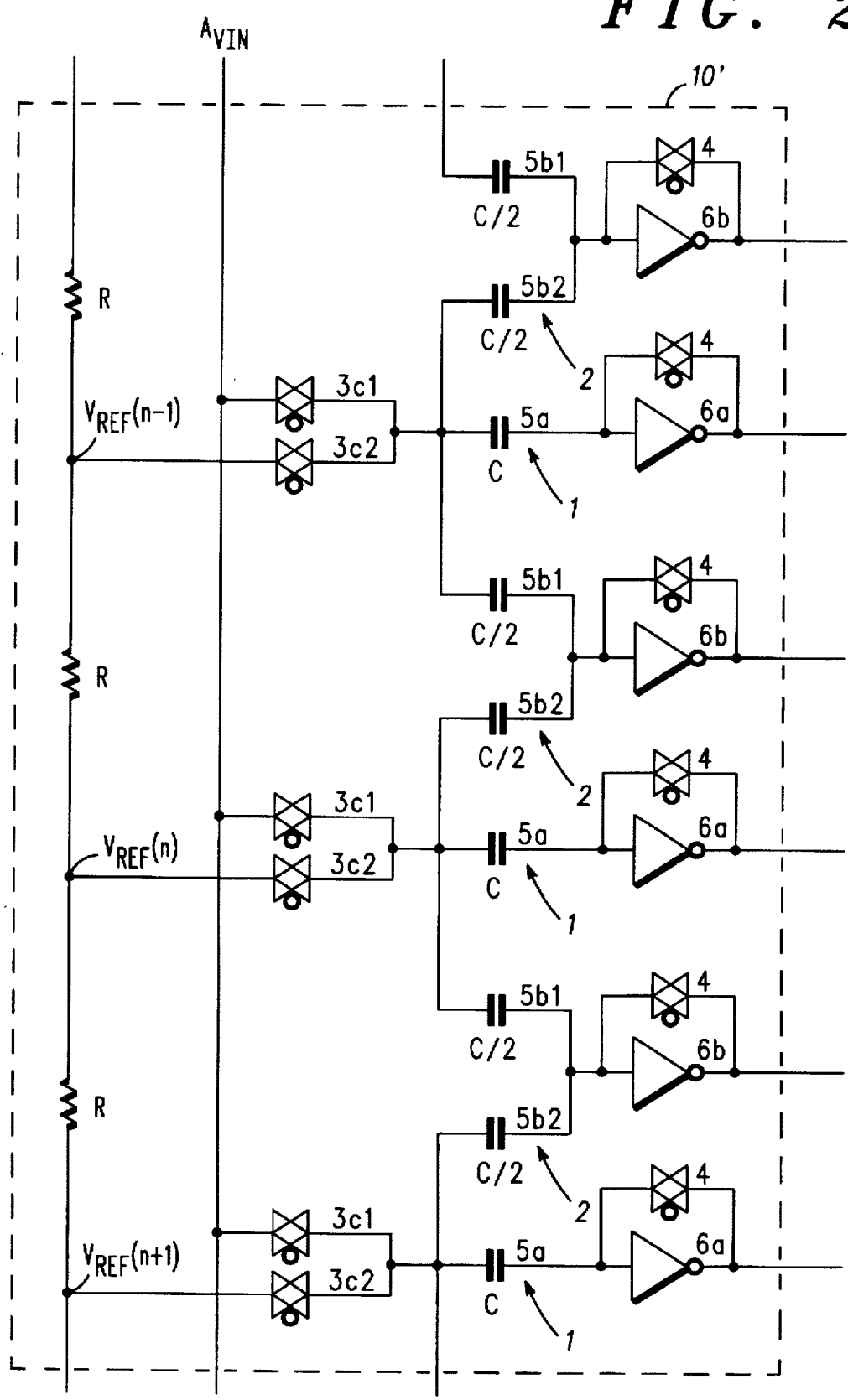
FIG. 2 is a circuit diagram depicting principal portions of an A/D converter according to another embodiment of the present invention.

FIG. 2 is a circuit diagram depicting principal portions of an A/D converter 10' according to another embodiment of the present invention, where the same components as shown in FIG. 1 are denoted by the same reference symbol.

The first comparator 1 of the present embodiment is so configured that a node between resistors R of the resistor series 30 and an analog voltage signal line to be compared are connected together via individual analog switches 3c1 and 3c2, while this node is connected to an input terminal of the inverter 6a via a capacitor 5a having a predetermined capacitance value of C.

The second comparator 2 of the present embodiment is so configured that a node between resistors R of the resistor series 30 and an analog voltage signal line to be compared are connected together via individual analog switches 3c1 and 3c2, while two nodes adjacent to each of the analog switches 3c1 and 3c2 are connected to an input terminal of the inverter 6b via capacitors 5b1 and 5b2, each having a capacitance value of C/2.

This allows for a substantial reduction in the number of analog switches used, as well as a reduction in real estate of the circuitry in the present embodiment, while retaining similar benefits of the afore-described embodiment.

Figure 3:
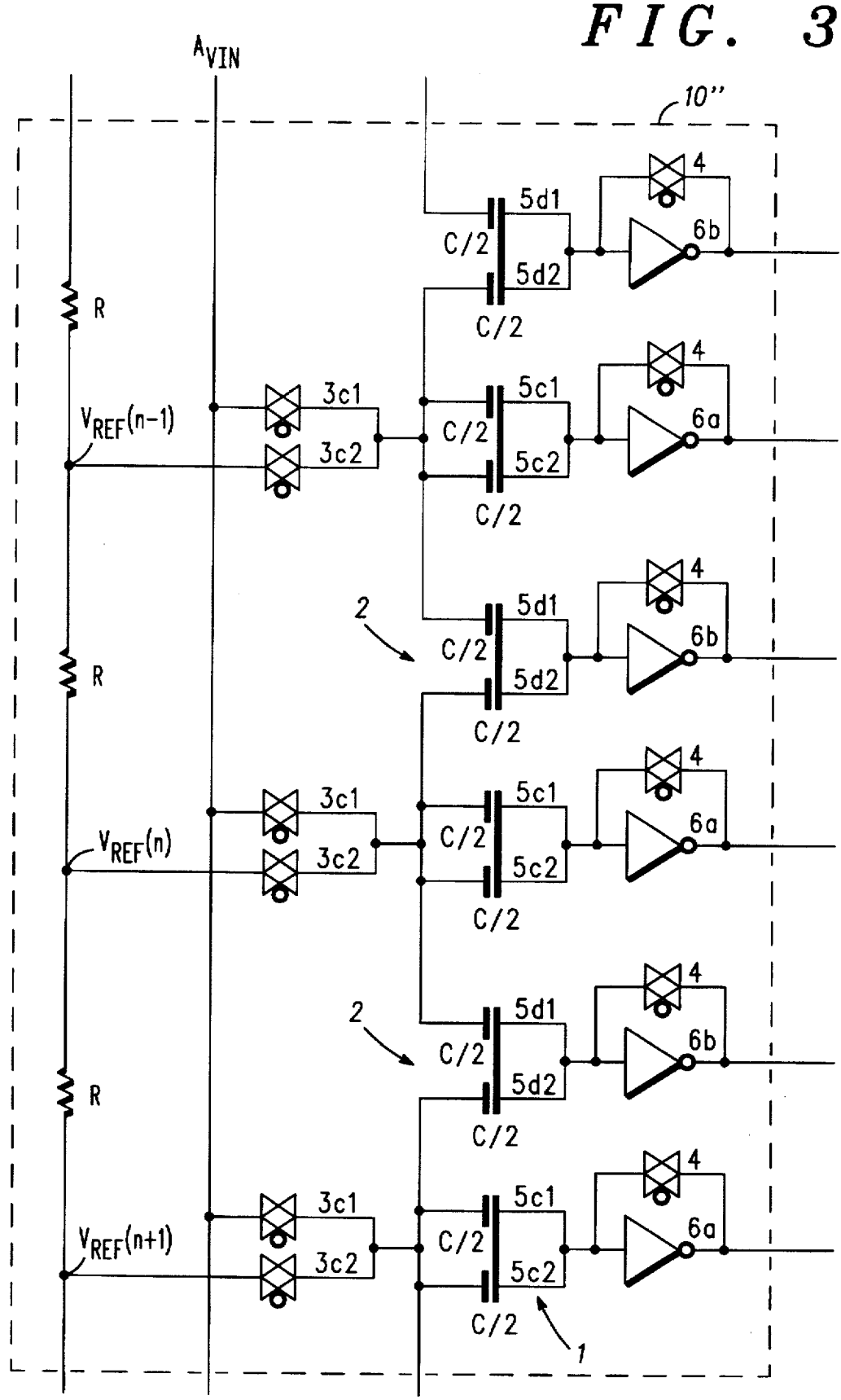
FIG. 3 is a circuit diagram depicting principal portions of an A/D converter according to still another embodiment of the present invention.

FIG. 3 is a circuit diagram depicting principal portions of an A/D converter 10" according to still another embodiment of the present invention, where the same components as shown in FIG. 2 are denoted by the same reference symbol.

The first comparator 1 of the present embodiment is so configured that a node between resistors R of the resistor series 30 and an analog voltage signal to be compared are connected together via individual analog switches 3c1 and 3c2, and this node has its one end connected in common, while the other end is connected to an input terminal of the inverter 6a via two capacitors 5c1 and 5c2 formed integrally on the same semiconductor substrate, the capacitors having a capacitance value of C/2.

The second comparator 2 of the present embodiment is so configured that a node between resistors R of the resistor series 30 and an analog voltage signal line to be compared are connected together via individual analog switches 3c1 and 3c2, and two nodes adjacent to each of the analog switches 3c1 and 3c2 are connected to an input terminal of the inverter 6b via capacitors 5d1 and 5d2 formed integrally on the same semiconductor substrate, the capacitors having a capacitance value of C/2.

As a result, in the present embodiment, by forming all capacitors, which comprise coupling capacitors, with a capacitance of C/2, the processing accuracy during the fabrication of semiconductor devices can be enhanced over the afore-described embodiments, while retaining similar benefits thereof.

According to the present invention, each average voltage of the reference voltages for the first comparators can be compared with an analog voltage by the second comparator, the first and second comparators may be disposed alternatively relative to the resistor series having a plurality of resistors connected in series between two terminals to which a predetermined reference voltage is applied, whereby the number of reference voltages can be equivalent to twice the number of taps, thereby increasing the number of bits for the A/D converter without increasing the number of resistor taps.

We claim:

1. An A/D converter comprising:

a resistor series having a plurality of resistors connected in series between two terminals to which predetermined reference voltages are applied;

a plurality of first switches, each connected to an analog voltage signal to be compared;

a plurality of second switches each connected to each node between adjacent resistors respectively;

a plurality of first inverters, each of said first inverters comparing a voltage at each of said nodes and said analog voltage signal, each of said node voltage to be compared and said analog voltage signal being alternately connected to an input terminal of said respective first inverter through each of said first and second switches and a capacitor having a predetermined capacitance; and a plurality of second inverters, each of said second inverters comparing an average voltage of the two node voltages across each of said plurality of resistors and said analog voltage signal, said two adjacent node voltages across each of said plurality of resistors to be compared and said analog voltage signal being alternately and directly connected to an input terminal of said respective second inverter through each of said first and second switches and a capacitor having a predetermined capacitance;

wherein said first and second comparators are disposed alternately.

* * * * *